(12) United States Patent
Li et al.

(10) Patent No.: US 8,684,793 B2
(45) Date of Patent: Apr. 1, 2014

(54) OXIDIZING PARTICLES BASED SLURRY FOR NOBEL METAL INCLUDING RUTHENIUM CHEMICAL MECHANICAL PLANARIZATION

(75) Inventors: Yuzhuo Li, Heidelberg (DE); Karpagavalli Ramji, Chicago, IL (US)

(73) Assignee: BASF SE, Ludwigshafen (DE)

( * ) Notice: Subject to any disclaimer, the term of this patent is extended or adjusted under 35 U.S.C. 154(b) by 323 days.

(21) Appl. No.: 13/266,520

(22) PCT Filed: May 6, 2010

(86) PCT No.: PCT/EP2010/056139
§ 371 (c)(1),
(2), (4) Date: Oct. 27, 2011

(87) PCT Pub. No.: WO2010/128094
PCT Pub. Date: Nov. 11, 2010

(65) Prior Publication Data
US 2012/0045970 A1   Feb. 23, 2012

Related U.S. Application Data

(60) Provisional application No. 61/176,513, filed on May 8, 2009.

(51) Int. Cl.
*B24B 1/00* (2006.01)

(52) U.S. Cl.
USPC ............ 451/36; 451/41; 216/88; 216/89; 252/79.1; 252/79.2; 438/693; 438/695

(58) Field of Classification Search
USPC ............ 451/41, 36; 216/88–89, 100, 108; 252/79.1, 79.2, 79.5; 438/693–695, 438/686
See application file for complete search history.

(56) References Cited

U.S. PATENT DOCUMENTS

| | | | |
|---|---|---|---|
| 6,783,690 B2 * | 8/2004 | Kologe et al. | 216/100 |
| 7,161,247 B2 * | 1/2007 | De Rege Thesauro et al. | 257/741 |
| 7,316,603 B2 * | 1/2008 | Carter et al. | 451/56 |
| 8,491,806 B2 * | 7/2013 | Hagan et al. | 216/88 |

(Continued)

FOREIGN PATENT DOCUMENTS

| | | |
|---|---|---|
| WO | 2007 050313 | 5/2007 |
| WO | 2008 057593 | 5/2008 |
| WO | 2008 151918 | 12/2008 |

OTHER PUBLICATIONS

U.S. Appl. No. 13/580,039, filed Aug. 20, 2012, Raman, et al.

(Continued)

*Primary Examiner* — George Nguyen
(74) *Attorney, Agent, or Firm* — Oblon, Spivak, McClelland, Maier & Neustadt, L.L.P.

(57) ABSTRACT

A method for chemical mechanical planarization of ruthenium is provided. A semiconductor substrate comprising ruthenium is contacted with a chemical mechanical polishing system comprising an oxidizing particle, an abrasive, a polishing pad and a liquid carrier. The pH of the polishing composition is about 8 to 12. A high ruthenium removal rate for the inventive slurry was observed. The disclosed oxidizing particle advantageously improves the polishing speed of ruthenium under low polishing pressure and decreases the scratches generated on low-k material.

20 Claims, 2 Drawing Sheets

(56) References Cited

U.S. PATENT DOCUMENTS

| | | | |
|---|---|---|---|
| 2005/0064798 A1* | 3/2005 | Hardikar | 451/41 |
| 2005/0261139 A1* | 11/2005 | Reddy et al. | 507/209 |
| 2006/0024967 A1* | 2/2006 | De Rege Thesauro et al. | 438/692 |
| 2006/0037942 A1* | 2/2006 | Yun et al. | 216/88 |
| 2007/0090094 A1 | 4/2007 | Thompson et al. | |
| 2008/0105652 A1 | 5/2008 | Brusic et al. | |
| 2008/0148649 A1 | 6/2008 | Liu | |
| 2010/0178768 A1 | 7/2010 | Li | |
| 2010/0216309 A1* | 8/2010 | Minami et al. | 438/693 |
| 2011/0171832 A1* | 7/2011 | Hagan et al. | 438/693 |
| 2011/0269312 A1 | 11/2011 | Li et al. | |
| 2013/0026134 A1* | 1/2013 | Nakagawa et al. | 216/55 |

OTHER PUBLICATIONS

U.S. Appl. No. 13/510,514, filed May 17, 2012, Raman, et al.
U.S. Appl. No. 13/510,830, filed May 18, 2012, Raman, et al.
U.S. Appl. No. 13/503,753, filed Apr. 24, 2012, Lauter, et al.
Kim, I-K., et al., "Effect of pH in Ru Slurry with Sodium Periodate on Ru CMP," Journal of the Electrochemical Society, vol. 156, No. 3, pp. H188-H192, (2009).
International Search Report Issued Aug. 25, 2010 in PCT/EP10/056139 Filed May 6, 2010.
U.S. Appl. No. 13/318,964, filed Nov. 4, 2011, Raman, et al.
U.S. Appl. No. 13/318,911, filed Nov. 4, 2011, Raman, et al.
U.S. Appl. No. 13/376,270, filed Dec. 5, 2011, Zhang, et al.

* cited by examiner

OXIDIZING PARTICLES BASED SLURRY FOR NOBEL METAL INCLUDING RUTHENIUM CHEMICAL MECHANICAL PLANARIZATION

INCORPORATION BY REFERENCE

Any foregoing applications, and all documents cited therein or during their prosecution ("application cited documents") and all documents cited or referenced in the application cited documents, and all documents cited or referenced herein ("herein cited documents"), and all documents cited or referenced in herein cited documents, together with any manufacturer's instructions, descriptions, product specifications, and product sheets for any products mentioned herein or in any document incorporated by reference herein, are hereby incorporated herein by reference, and may be employed in the practice of the invention. Citation or identification of any document in this application is not an admission that such document is available as prior art to the present invention.

FIELD OF THE INVENTION

The present invention pertains to compositions and associated methods for chemical mechanical planarization of ruthenium. In particular, a composition for ruthenium chemical mechanical planarization containing an oxidizing particle and an abrasive suspended in a liquid carrier is disclosed.

BACKGROUND OF THE INVENTION

Chemical mechanical polishing (CMP—also referred to as chemical mechanical planarization or chemical mechanical etching) is a well-known technology used in fabricating advanced photonic, microelectromechanical (MEM), and microelectronic devices, such as semiconductor wafers. See e.g. Chemical-Mechanical Processing (Springer Series in Materials Science), Michael R. Oliver, Springer Publ., (Mar. 24, 2006); Microchip Fabrication, Peter Van Zant, McGraw-Hill (2004); Chemical Mechanical Polishing in Silicon Processing, Volume 63 (Semiconductors and Semimetals), Eds. Shin Hwa Li and Robert O. Miller, Academic Press (1999); Chemical Mechanical Planarization of Microelectronic Materials, Steigerwald et al., John Wiley & Sons (1997).

In the field of semiconductor fabrication, chemical mechanical polishing is used to planarize metal and/or oxide substrates. CMP uses both chemical and mechanical action to obtain the desired planarity of the surface to be polished. Chemical action is provided by a mixture of chemicals which is termed as "slurry" usually consisting of abrasives and various additive compounds which include family of chelating agents, passivating agents, oxidizing agents, accelerators etc., Mechanical action is provided by pressing to-be-polished substrate onto the surface of a polishing pad adhered to a moving platen. Movement of platen is typically linear, rotational or orbital. In a typical chemical mechanical polishing process, a rotating wafer holder brings the wafer to be in contact with a polishing pad or CMP pad. One of the key consumables in conventional CMP processes is the CMP pad or polishing pad. The CMP pad is mounted on a rotating platen. A polishing medium, such as an abrasive slurry, is applied between the wafer and the pad.

The invention relates to chemical mechanical planarizing formulation for selectively removing ruthenium metal layers in the presence of interconnect structures of integrated circuit devices. Copper (Cu) is being used as an interconnect metal in the sub-100 nm generation of integrated circuits to enhance operating speed and reliability. Diffusion barriers like tantalum (Ta) and tantalum nitride (TaN) are currently deposited in the damascene trench/via features by physical vapor deposition (PVD) to contain Cu interconnects to prevent catastrophic contamination caused by copper diffusion. An additional Cu seed layer is deposited on Ta/TaN to ensure the success of bottom up Cu electrofill process. Recent advances in PVD technology has extended the applicability of Ta/TaN barrier down to the 90 nm node and likely into 65 nm as well. However, Cu-seed/Ta/TaN tri-layer configuration will encounter scaling difficulties in the case of 45 nm node. The thickness of a functional diffusion barrier is limited to 5 nm or less at the 45 nm node. Hence, a single layer Cu plateable diffusion barrier is desirable to optimize the overall integration by eliminating Cu seed layer for the advanced 65-45 nm nodes.

Ruthenium (Ru) is a promising metal for Cu diffusion barrier which affords direct Cu electroplating without the need of an additional Cu seed layer. Ru is an air stable transition metal with high melting point (2310° C.) and is nearly twice as thermally and electrically conductive (7.6 $\mu\Omega$.cm) as Ta. Similar to Ta, Ru shows negligible solid solubility with Cu even at 900° C.

Typical ruthenium slurry in required to remove the barrier material without adversely impacting the dielectric or electrical properties of interconnect structure. Polishing compositions that have been developed for Ru and other noble metals typically contain strong oxidizing agents and working at a low pH. Cu tends to oxidize very rapidly in these polishing compositions. Additionally, because of the difference in standard reduction potentials of Ru and Cu, Cu suffers from galvanic attack by Ru in the presence of conventional Ru polishing compositions. Galvanic corrosion leads to etching of Cu lines and a resulting degradation of circuit performance. Further, the wide difference in chemical reactivity of Cu and Ru in conventional polishing compositions results in widely differing rates of removal of substrates containing both the metals, which can result in over-polishing of Cu. In view of the above, there exists a need to provide ruthenium slurry that possesses a high removal rate of ruthenium and controlled removal of dielectric and copper interconnects.

A need remains for polishing slurry that will provide desirable planarization efficiency, uniformity and removal rate while minimizing defectivity, such as surface imperfections and damage to underlying structures and topography during chemical mechanical planarization. Improved polishing systems are particularly needed for polishing noble metal containing substrates, since noble metals are known to be chemically stable and mechanically hard materials. The present invention seeks to provide such a chemical mechanical polishing system for substrates comprising Ru.

SUMMARY OF THE INVENTION

The invention discloses polishing slurry for chemical mechanical planarization of Ru under low polishing pressure for semiconductor devices and a method for polishing therein. The polishing slurry comprises uniformly dispersed oxidizing particles, an abrasive and water. The pH of the polishing slurry is about 8 to about 12.

It is noted that in this disclosure and particularly in the claims and/or paragraphs, terms such as "comprises", "comprised", "comprising" and the like can have the meaning attributed to it in U.S. patent law; e.g., they can mean "includes", "included", "including", and the like; and that terms such as "consisting essentially of" and "consists essentially of" have the meaning ascribed to them in U.S. patent law, e.g., they allow for elements not explicitly recited, but exclude elements that are found in the prior art or that affect a basic or novel characteristic of the invention.

It is noted that, as used in this specification and the appended claims, the singular forms "a," "an," and "the" include plural referents unless expressly and unequivocally limited to one referent.

For the purposes of this specification, unless otherwise indicated, all numbers expressing quantities of ingredients, reaction conditions, and other parameters used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not as an attempt to limit the application of the doctrine of equivalents to the scope of the claims, each numerical parameter should at least be construed in light of the number of reported significant digits and by applying ordinary rounding techniques.

All numerical ranges herein include all numerical values and ranges of all numerical values within the recited numerical ranges. Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

All "% by weight" is based on the total weight of the composition, solution or slurry except where otherwise indicated.

It is further noted that the invention does not intend to encompass within the scope of the invention any previously disclosed product, process of making the product or method of using the product, which meets the written description and enablement requirements of the USPTO (35 U.S.C. 112, first paragraph) or the EPO (Article 83 of the EPC), such that applicant(s) reserve the right and hereby disclose a disclaimer of any previously described product, method of making the product or process of using the product.

The various embodiments and examples of the present invention as presented herein are understood to be illustrative of the present invention and not restrictive thereof and are non-limiting with respect to the scope of the invention. These and other embodiments are disclosed or are apparent from and encompassed by, the following Detailed Description of the Invention.

DETAILED DESCRIPTION OF THE INVENTION

Figure 1:
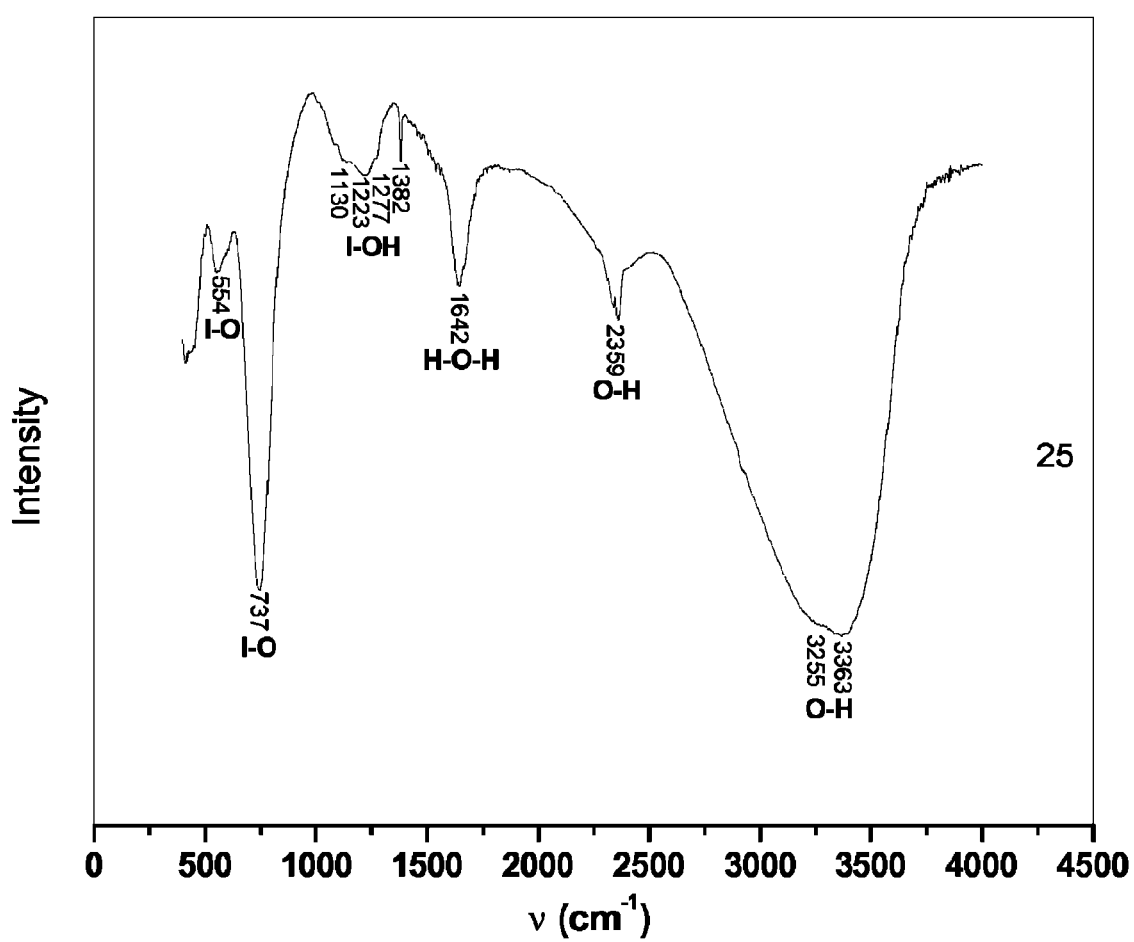
FIG. 1 depicts IR spectrum of calcium periodate in the region 400-4000 cm-1.

Chemical mechanical polishing slurry which provide desirable planarization efficiency, uniformity and removal rate while minimizing defectivity, such as surface imperfections and damage to underlying structures and topography during chemical mechanical planarization comprise of oxidizing particles, an abrasive, a polishing pad and water as liquid carrier is disclosed. If an abrasive is present, the abrasive can be any suitable form (e.g., abrasive particles). The polishing pad can be any suitable polishing pad, many of which are known in the art.

In one embodiment of the invention the chemical-mechanical polishing system comprises of:
(a) oxidizing particles;
(b) abrasive;
(c) liquid carrier; and
(d) a pH adjustor to maintain the slurry at alkaline pH.

The oxidizing particles are added to the polishing slurry to oxidize the metal layer to its corresponding oxide. For example, in the present invention oxidizing particles are used to oxidize the metal layer such as ruthenium to ruthenium oxide. Then the layer is mechanically polished to remove ruthenium oxide from the layer. The oxidizing particles are synthesized using alkaline earth metal cation and strong oxidizing counter-anion.

The alkaline earth metal cation is selected from the group consisting of beryllium, mag-nesium, calcium, strontium, barium and radium. The counter-anion is selected from strong oxidizers such as peroxides, periodates, perchlorates, permanganates and persulfates.

The oxidizing particles are present in the slurry in an amount sufficient to ensure rapid oxidation of the metal layer while balancing the chemical and mechanical polishing components of the slurry. The slurry may comprise between 0.2 wt. % and 0.5 wt. % of the particles depending on the rate of removal required. The removal rate of oxidizing particle is a function of particle concentration and pH. In one embodiment when a high Ru removal rate is desired, the oxidizing particle concentration of 0.5 wt. % and pH of 8 are preferred.

The abrasive can be any suitable abrasive, for example, the abrasive can be natural or synthetic, and comprises metal oxide. The metal oxide is selected from the group consisting of silica, alumina, ceria, zirconia, co-formed products thereof, and combinations thereof. More preferably, the abrasive is silica or alumina. Most preferably, the metal oxide comprises colloidal silica. For instance, the abrasive is colloidal silica. The abrasive can also comprise other forms of silica, such as fumed silica. The abrasive particles typically have an average particle size of about 20 nm to about 500 nm. Preferably, the abrasive particles have an average particle size of about 20 nm to about 75 nm.

The abrasive can be employed in form of a dispersion (pre-dispersion). Preferably, the pre-dispersion is an aqueous dispersion. The concentration of the abrasive particles in the pre-dispersion can vary within a wide range. Preferably, the concentration of the abrasive particles in the pre-dispersion is from 10 wt. % to 50 wt. %. More preferably, the concentration of the abrasive particles in the pre-dispersion is from 25 wt. % to 35 wt. %.

The polishing slurry can comprise any suitable amount of abrasive. Typically, about 2 wt. % or more abrasive will be present in the polishing composition. More typically, about 5.0% or more abrasive will be present in the polishing composition. The amount of abrasive in the polishing slurry will not exceed 20 wt. %, more typically will not ex-ceed about 10 wt. % (e.g., will not exceed about 5 wt. %). Preferably, the amount of abrasive in the polishing composition is about 2 wt. % to about 5 wt. %.

The polishing system can comprise any suitable polishing pad. Moreover, suitable polishing pads can comprise any suitable polymer. Suitable polymers include, for example, polyvinylchloride, polyyvinylfluoride, nylon, fluorocarbon, polycarbonate, polyester, polyacrylate, polyether, polyethylene, polyamide, polyurethane, polystyrene, polypropylene, elastomers, polyolefins, polyvinylalcohols, natural and synthetic rubbersstyrenic polymers, polyaromatics, fluoropolymers, polyimides, cross-linked polyurethanes, thermoset polyurethanes, cross-linked polyolefines, polyethers, polyesters, polyacrylates, elastomeric polyethylenes, copolymers and block copolymers thereof, and mixtures and blends thereof, coformed products thereof, and mixtures thereof.

The polishing composition can have any suitable pH. Preferably, the polishing composition has a pH of about 7 to about 12, more preferably about 8 to about 9. The pH of the polishing composition can be achieved and/or maintained by any suitable means. More specifically, the polishing composition can further comprise a pH adjustor. The pH adjustor can be any suitable pH-adjusting compound. For example, the pH adjustor can be any suitable acid or base strong enough to produce the desired final pH. Examples of suitable acids include nitric acid, acetic acid, phosphoric acid, and the like. Examples of suitable bases include potassium hydroxide, ammonium hydroxide, and tetraalkyl ammonium hydroxide. The polishing composition can comprise any suitable amount of pH adjustor, provided such amount is sufficient to achieve and/or maintain the pH of the polishing composition within the ranges set forth herein.

The polishing slurry of the present invention has been found useful in providing effective polishing to ruthenium layers at desired polishing rates.

Another embodiment of the invention is using the chemical mechanical polishing slurries of the invention for polishing a substrate which comprises:
(i) contacting a substrate comprising at least one noble metal layer such as ruthenium with a chemical-mechanical polishing system comprising:
(a) oxidizing particles
(b) abrasive
(c) liquid carrier, and
(d) pH adjustor to maintain the slurry at alkaline pH, and
(ii) abrading at least a portion of the noble metal layer of the substrate to polish the noble metal layer,
wherein the noble metal is selected from the group consisting of rhenium, ruthenium, rhodium, palladium, silver, osmium, iridium, platinum and gold.

Preferably, the oxidizing particles (a) which are comprised in the chemical-mechanical polishing system are selected from the group consisting of alkaline earth metal peroxides, periodates, perchlorates, permanganates and persulfates. Most preferably, the oxidizing particles (a) are alkaline earth metal periodates. For example, the oxidizing particles (a) are calcium periodate.

Preferably, this chemical-mechanical polishing system comprises
(a) oxidizing particles selected from the group of alkaline earth metal peroxides, periodates, perchlorates, permanganates and persulfates
(b) silica as abrasive,
(c) liquid carrier,
(d) a pH adjustor to maintain the slurry at alkaline pH.

Most preferably, this chemical-mechanical polishing system comprises
(a) alkaline earth metal periodates as oxidizing particles,
(b) colloidal silica as abrasive,
(c) water as liquid carrier,
(d) a pH adjustor to maintain the slurry at alkaline pH.

For instance, this chemical-mechanical polishing system comprises
(a) 0.25 to 0.5 wt. % calcium periodate as oxidizing particle,
(b) 2 to 5 wt. % colloidal silica as abrasive,
(c) water as liquid carrier,
(d) potassium hydroxide or nitric acid as a pH adjustor to maintain the slurry at alkaline pH.

In another embodiment of polishing the substrate, the oxidizing particles comprise alkaline earth metal cation and a counter-anion selected from strong oxidizers such as peroxides, periodates, perchlorates, permanganates and persulfates.

In another embodiment of polishing the substrate, the alkaline earth metal cation is selected from beryllium, magnesium, calcium, strontium, barium and radium.

In another embodiment of polishing the substrate, the alkaline earth metal salt is calcium nitrate.

In another embodiment of polishing the substrate, the strong oxidizer is periodic acid.

In another embodiment of polishing the substrate, the oxidizing particle is a per-type oxidizer.

In another embodiment of polishing the substrate, the per-type oxidizing particle is calcium periodate.

In another embodiment of polishing the substrate, the chemical mechanical polishing system comprises an abrasive, and the abrasive is a metal oxide.

In another embodiment of polishing the substrate, the abrasive is selected from the group consisting of silica, alumina, titania, ceria, zirconia, germania, magnesia, coformed products thereof and combinations thereof.

In another embodiment of polishing the substrate, the abrasive is silica.

In another embodiment of polishing the substrate, the abrasive is colloidal silica.

In another embodiment of polishing the substrate, the chemical mechanical polishing system comprises an abrasive and the abrasive is in particulate form and is suspended in the carrier.

In another embodiment of polishing the substrate, the liquid carrier is water.

In another embodiment of polishing the substrate, the pH adjustor is potassium hydroxyide or nitric acid.

In another embodiment of polishing the substrate, the pH of the slurry is alkaline.

In another embodiment of polishing the substrate, the pH of the slurry is 8.

In another embodiment of polishing the substrate, the system comprises 0.25-0.5 wt. % of oxidizing particles and 2-5 wt. % of abrasive, and water.

In another embodiment of polishing the substrate, the oxidizing particle is calcium periodate and the abrasive is silica.

In another embodiment of polishing the substrate, the noble metal is selected from the group consisting of rhenium, ruthenium, rhodium, iridium and platinum.

In another embodiment of polishing the substrate, the noble metal is ruthenium.

In another embodiment of polishing the substrate, the copper removal rate the copper removal rate is less than 10 Å/min. Another embodiment of the copper removal rate is less than 10 Å/min. Yet another embodiment of the copper removal rate is zero Å/min. In another embodiment of polishing the substrate, the selectivity with respect to removal rate in Å/min exhibited by the inventive polishing slurry is about 2:1 to about 10:1 for a nobel metal over tantalum. Another embodiment of the selectivity is about 4:1 to about 8:1. In yet another embodiment of the selectivity, the nobel metal is ruthenium.

In another embodiment of polishing the substrate, the selectivity with respect to removal rate in Å/min exhibited by the inventive polishing slurry about 20:1 to about 100:1 for a nobel metal over PETEOS (plasma-enhanced tetraethylosilicate). Another embodiment of the selectivity is about 40:1 to about 80:1. In yet another embodiment of the selectivity, the nobel metal is ruthenium.

The invention is further described by the following non-limiting examples which further illustrate the invention, and are not intended, nor should they be interpreted to, limit the scope of the invention.

EXAMPLES

The polishing experiments reflected in the examples generally involved use of a commercially available polishing apparatus with 13.8 kPa (2 psi) downforce pressure of the substrate against the polishing pad, 75 rpm platen speed, and 65 rpm carrier speed. The polishing pad employed was a polyurethane pad.

The pre-dispersion P1 is a dispersion of 30 wt. % colloidal silica in water (Ludox® AM30).

Example 1

Preparation of the Slurry

Solution A was prepared by adding 5 g of periodic acid (Sigma-Aldrich) to 83.5 g of colloidal silica having a grain size below 50 nm and 411.5 g of water and stirred until periodic acid was completely dissolved. Solution B was prepared by adding 2.5 g of calcium nitrate (Baker analyzed) to 83.5 g of colloidal silica having a grain size below 50 nm and 414 g of water and stirred until calcium nitrate was completely dissolved. Solutions A and B were mixed using a spin disc reactor with a speed of about 1000 rpm so that particles can not be agglomerated. Then after, the pH of the mixture was adjusted to 8 using potassium hydroxide or nitric acid to obtain the polishing slurry. The size of the particles, as measured by ALV-NIBS high performance particle sizer, was ranging from about 20 to about 36 nm. The size of oxidizing particles of the present invention is less than 50 nm in order to avoid scratching, pit marks, divots and other surface imperfections during polishing. Zeta potential of −33 mV was observed for the prepared polishing slurry, as measured by BIC Zeta potential analyzer (Brookhaven Instruments Corporation, USA).

Figure 2:
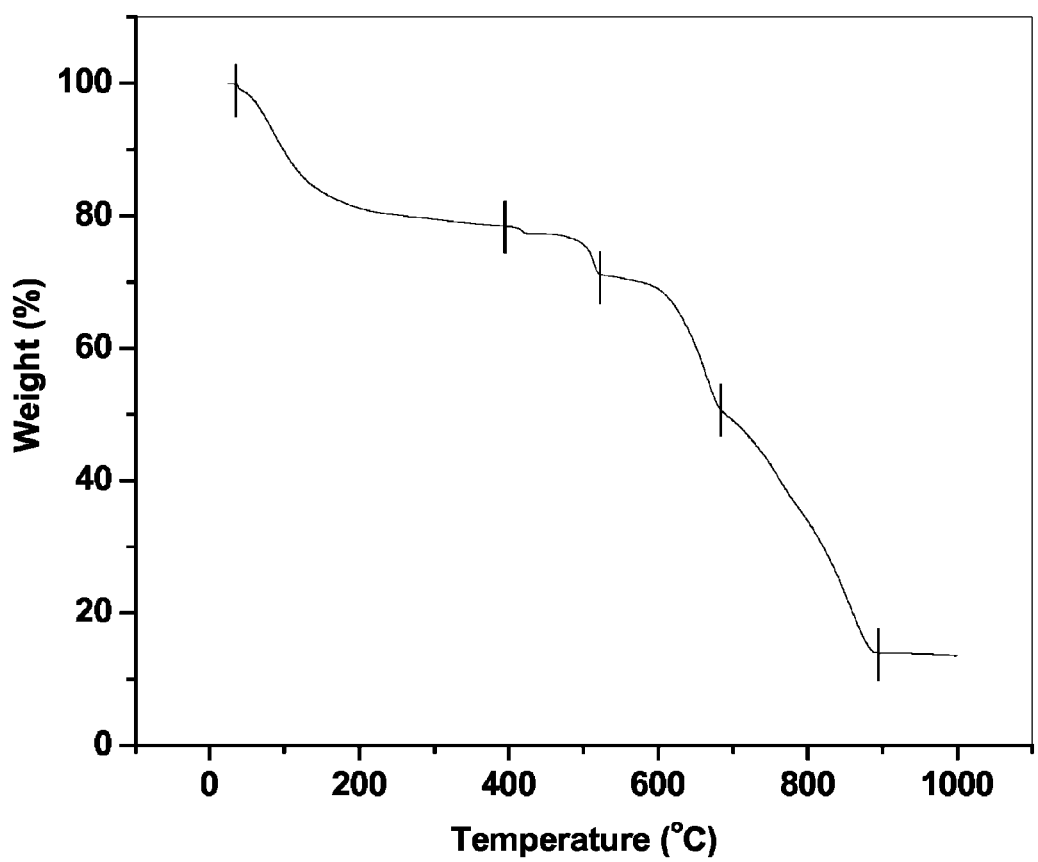
FIG. 2 depicts TGA for calcium periodate.

Calcium periodate oxidizing particles are synthesized in the absence of colloidal silica abrasive to investigate the chemical nature of the particles. Solution A was prepared by adding 5 g of periodic acid to 495 g of water and stirred until periodic acid was completely dissolved. Solution B was prepared by adding 2.5 g of calcium nitrate to 497.5 g of water and stirred until calcium nitrate was completely dissolved. Solutions A and B were mixed using a spin disc reactor with a speed of about 1000 rpm and then the pH of the mixture was adjusted to 8 using potassium hydroxide or nitric acid. The synthesized calcium periodate particles were analyzed using infra-red spectroscopy (IR) and thermogravimetry analysis (TGA). IR spectrum was recorded in the region of 400-4000 cm-1 in KI pellet using Galaxy 2020. TGA was performed using Perkin-Elmer Pyris series TGA 1. IR spectrum of the synthesized calcium periodate is shown in FIG. 1. The presence of $H_3IO_6{}^{2-}$ is confirmed by the absorption bands at 554 and 737 cm-1 due to stretching vibration of I—O. The characteristic absorption bands for de-formation vibration of I—OH are observed at 1130, 1223, 1277 and 1382 cm-1. The absorption bands at 1642 cm-1 is due to H—O—H bending and 2359, 3255 and 3363 cm-1 are due to O—H stretching. TGA curve for the synthesized calcium periodate is shown in FIG. 2. TGA data in Table 1 pointed out that the precipitate formed is $CaH_3IO_6 \cdot 3H_2O$.

TABLE 1

TGA data for calcium periodate

| Phase transition | Weight loss (experimental), % | Weight loss (theoretical), % |
|---|---|---|
| $2CaH_3IO_6 \cdot 3H_2O \rightarrow 2CaH_3IO_6 + 6H_2O$ | 21.7 | 19.0 |
| $2CaH_3IO_6 \rightarrow 2CaHIO_5 + 2H_2O$ | 7.4 | 6.3 |
| $2CaHIO_5 \rightarrow CaO + Ca(IO_3)_2 + H_2O + O_2$ | 20.4 | 18.7 |
| $Ca(IO_3)_2 \rightarrow CaO + I_2 + 2.5O_2$ | 36.9 | 41.1 |

Example 2

This example demonstrates the removal rates for polishing ruthenium with six different polishing slurry compositions (Polishing Compositions A, B, C, D, E and F). Each of the compositions comprised of 2% of the pre-dispersion P1 and various concentrations of calcium periodate oxidizing particles at a pH of 8 in water. Polishing composition A contained 0.5% calcium periodate oxidizing particles. Polishing composition B contained 0.45% calcium periodate oxidizing particles. Polishing composition C contained 0.4% calcium periodate oxidizing particles. Polishing composition D contained 0.35% calcium periodate oxidizing particles. Polishing composition E contained 0.3% calcium periodate oxidizing particles. Polishing composition F contained 0.25% calcium periodate oxidizing particles.

The removal rate for ruthenium was determined for each of the polishing compositions and the results are summarized in Table 2.

TABLE 2

| Polishing composition | P1 (wt. %) | Calcium periodate oxidizing particles (wt. %) | Ru RR (Å/min) |
|---|---|---|---|
| A | 2.0 | 0.5 | 960 |
| B | 2.0 | 0.45 | 1040 |
| C | 2.0 | 0.4 | 790 |
| D | 2.0 | 0.35 | 780 |
| E | 2.0 | 0.3 | 720 |
| F | 2.0 | 0.25 | 610 |

As is apparent from the results set forth in Table 2, polishing slurries of the present invention were effective in achieving acceptable ruthenium removal rates. Moreover, it can be seen that the concentration of oxidizing particles have an impact on the removal rate of ruthenium. Ruthenium removal rate is found to be increased with increasing oxidizing particles concentration. Polishing composition A, which contained 0.5% oxidizing particles exhibited higher removal rate for ruthenium as compared with polishing composition F, which comprised 0.25% of oxidizing particles.

Thus, the results of this example demonstrate the capability of the inventive calcium periodate oxidizing particles to polish ruthenium substrate with controllable removal rates by varying the concentration of the calcium periodate oxidizing particles.

Example 3

To investigate the effect of abrasive content, three separate substrates comprising copper, ruthenium and tantalum were polished with five different polishing slurry compositions (polishing compositions A, B, C, D and E) comprising various concentrations of abrasives and 0.25 wt. % of calcium periodate oxidizing particles at a pH of 8 in water.

Following polishing, the removal rates for copper, ruthenium and tantalum were determined and the results are given in Table 3.

TABLE 3

| Polishing composition | P1 (wt. %) | Calcium periodate oxidizing particles (wt. %) | Cu RR (Å/min) | Ru RR (Å/min) | Ta RR (Å/min) |
|---|---|---|---|---|---|
| A | 2.0 | 0.25 | 0 | 610 | 0 |
| B | 3.0 | 0.25 | 0 | 660 | 10 |
| C | 4.0 | 0.25 | 0 | 680 | 60 |
| D | 5.0 | 0.25 | 0 | 680 | 110 |

The abrasive content of the polishing slurry have been found to have a slight effect on the ruthenium and tantalum removal rates and no copper removal rate was observed.

Example 4

Four slurries were prepared to illustrate the effect of pH of the slurry consisting of 5 wt. % of the pre-dispersion P1 and 0.25 wt. % calcium periodate oxidizing particles on the removal rate of copper, ruthenium and tantalum. Table 4 illustrate Cu, Ru and Ta removal rates for the polishing slurry with 5 wt. % of the pre-dispersion P1 and 0.25 wt. % of calcium periodate oxidizing particles at various pH.

TABLE 4

| Polishing composition | P1 (wt. %) | Calcium periodate oxidizing particles (wt. %) | pH | Cu RR (Å/min) | Ru RR (Å/min) | Ta RR (Å/min) |
|---|---|---|---|---|---|---|
| A | 5.0 | 0.25 | 7 | 0 | 940 | 110 |
| B | 5.0 | 0.25 | 8 | 0 | 680 | 110 |
| C | 5.0 | 0.25 | 9 | 0 | 490 | 110 |
| D | 5.0 | 0.25 | 10 | 130 | 260 | 150 |

From the results, it is apparent that although a significant effect on copper and tantalum removal rates was observed at pH 10, ruthenium removal rate was found to be decreased with increasing pH of the slurry.

Example 5

Four separate substrates comprising copper, ruthenium, tantalum and PETEOS were polished with a polishing composition comprising 5 wt. % of the pre-dispersion P1 and 0.25 wt. % calcium periodate oxidizing particles at a pH of 8 in water. Following polishing the removal rates for copper, ruthenium, tantalum and PETEOS were determined and the results are illustrated in Table 5.

TABLE 5

| Polishing composition | P1 (wt. %) | Calcium periodate oxidizing particles (wt. %) | Cu RR (Å/min) | Ru RR (Å/min) | Ta RR (Å/min) | PETEOS (Å/min) |
|---|---|---|---|---|---|---|
| A | 5.0 | 0.25 | 0 | 680 | 110 | 11 |

The polishing slurry exhibited no copper removal rate. The selectivity exhibited by the inventive polishing slurry was about 6.18:1 for ruthenium over tantalum and 61.82:1 for ruthenium over PETEOS (plasma-enhanced tetraethylosilicate).

As described herein, the polishing slurry of the present invention has been found particularly useful in chemical mechanical planarization of ruthenium. A high removal rate of ruthenium can be achieved using the inventive polishing slurry even at low contact pressure.

It is further understood that the present invention is not limited to the particular embodiments shown and described herein, but that various changes and modifications may be made without departing from the scope and spirit of the invention.

What is claimed is:

1. A method of polishing a substrate, comprising:
   (i) contacting a substrate comprising at least one noble metal layer with a chemical-mechanical polishing system comprising
      (a) uniformly dispersed oxidizing particles comprising at least one alkaline earth metal periodate,
      (b) an abrasive,
      (c) a liquid carrier, and
      (d) a pH adjustor to maintain a resulting slurry at alkaline pH; and
   (ii) abrading at least a portion of the noble metal layer to polish the noble metal layer,
   wherein the noble metal is selected from the group consisting of rhenium, ruthenium, rhodium, palladium, silver, osmium, iridium, platinum and gold.

2. The method of claim 1, wherein the polishing system comprises 0.2 wt. % to 0.5 wt. % of the oxidizing particles.

3. The method of claim 1, wherein the oxidizing particles are calcium periodate.

4. The method of claim 1, wherein the abrasive comprises abrasive particles having a particle size of 20 nm to 75 nm.

5. The method of claim 1, wherein the abrasive comprises a metal oxide.

6. The method of claim 5, wherein the metal oxide is at least one selected from the group consisting of silica, alumina, titania, ceria, zirconia, germania, magnesia, and co-formed products thereof.

7. The method of 6, wherein the metal oxide is silica.

8. The method of claim 7, wherein the metal oxide is colloidal silica.

9. The method of claim 1, wherein the pH adjustor is potassium hydroxide or nitric acid.

10. The method of claim 1, wherein the pH of the resulting slurry is alkaline.

11. The method of claim 1, wherein the pH of the resulting slurry is 8 to 9.

12. The method of claim 1, wherein the polishing system comprises 0.25.-0.5 wt. % of the oxidizing particles, 2-5 wt. % of the abrasive, and the liquid carrier is water.

13. The method of claim 12, wherein the oxidizing particles comprise calcium periodate and the abrasive comprises silica.

14. The method of claim 1, wherein the noble metal is selected from the group consisting of rhenium, ruthenium, rhodium, iridium and platinum.

15. The method of claim 1, wherein the noble metal is ruthenium.

16. The method of claim 2, wherein the oxidizing particles are calcium periodate.

17. The method of claim 2, wherein the abrasive comprises a metal oxide.

18. The method of claim 17, wherein the metal oxide is at least one selected from the group consisting of silica, alumina, titania, ceria, zirconia, germania, magnesia, and co-formed products thereof.

19. The method of claim 18, wherein the metal oxide is silica.

20. The method of claim 19, wherein the metal oxide is colloidal silica.

* * * * *